US012660361B2

(12) United States Patent
Kim et al.

(10) Patent No.:  US 12,660,361 B2
(45) Date of Patent:  Jun. 16, 2026

(54) SYSTEMS AND METHODS FOR HYBRID PIN PBSE MID-WAVELENGTH INFRARED (MWIR) PHOTODETECTORS

(71) Applicant: Illinois Tool Works Inc., Glenview, IL (US)

(72) Inventors: Richard S. Kim, Irvine, CA (US); Jeung Hun Park, Palisades Park, NJ (US); Russell Dahl, Simi Valley, CA (US)

(73) Assignee: Illinois Tool Works Inc.

( * ) Notice: Subject to any disclaimer, the term of this patent is extended or adjusted under 35 U.S.C. 154(b) by 438 days.

(21) Appl. No.: 18/301,027

(22) Filed: Apr. 14, 2023

(65) Prior Publication Data

US 2023/0343889 A1  Oct. 26, 2023

Related U.S. Application Data

(60) Provisional application No. 63/333,616, filed on Apr. 22, 2022.

(51) Int. Cl.
*H10F 71/00* (2025.01)
*H10F 30/221* (2025.01)
*H10F 30/223* (2025.01)
*H10F 77/12* (2025.01)

(52) U.S. Cl.
CPC ......... *H10F 71/00* (2025.01); *H10F 30/2218* (2025.01); *H10F 30/223* (2025.01); *H10F 77/127* (2025.01)

(58) Field of Classification Search
CPC .............................. H10F 71/00; H10F 30/223
See application file for complete search history.

(56) References Cited

U.S. PATENT DOCUMENTS 5,093,589 A  3/1992  Miyamoto

FOREIGN PATENT DOCUMENTS

JP  2010212469  9/2010

OTHER PUBLICATIONS

Int'l Search Report and Written Opinion Appln No. PCT/US2023/018830 mailed Jun. 20, 2023.
Ren Y.X. et al: "Fabrication of lead 1-9 selenide thin film photodiode for near-infrared detection via O2-plasma treatment", Journal of Alloys and Compounds, vol. 753, Mar. 19, 2018 (Mar. 19, 2018), pp. 6-10, XP055806362, CH ISSN: 0925-8388, DOI:10.1016/j.jallcom.2018.03.227.

(Continued)

*Primary Examiner* — Matthew L Reames
(74) *Attorney, Agent, or Firm* — MCANDREWS HELD & MALLOY, LTD.

(57) ABSTRACT
Methods and systems are provided for photodetectors employing a hybrid PIN or PN Lead Selenium (PbSe) junction. In some examples, the PbSe junction can include one or more semiconducting layers, including n-type layers, n+-type layers, p(i)-type layers, and/or p+-type layers, as a list of non-limiting examples. Photodetectors employing PbSe PIN or PN junctions are created. Also disclosed are methods for preparing photo-sensitive PbSe semiconducting layers for detection of electromagnetic energy (e.g., mid-wavelength infrared (MWIR)).

19 Claims, 3 Drawing Sheets

(56)            References Cited

OTHER PUBLICATIONS

Kasiyan Vladimir et al: "Infrared detectors based on semiconductor junction of PbSe", Journal of Applied Physics, American Institute of Physics, 2 Huntington Quadrangle, Melville, NY 11747, vol. 112, No. 8, Oct. 15, 2012 (Oct. 15, 2012), pp. 86101-86101, XP012167763, ISSN: 0021-8979, DOI: 10.1063/1.4759011 [retrieved on Oct. 17, 2012].

Zogg H et al: "Photovoltaic IV-VI on Si Infrared Sensor Arrays for Thermal Imaging", Optical Engineering, Soc. of Photo-Optical Instrumentation Engineers, Bellingham, vol. 34, No. 7, Jul. 1, 1995 (Jul. 1, 1995), pp. 1964-1969, XP000517063, ISSN: 0091-3286, DOI: 10.1117/12.200617.

200

202 — Substrate Preparation

204 — Formation of ion-implantation Layer

206 — Deposition of First Layer

208 — Deposition of Second Layer

209 — Control Carrier Concentration of Second Layer

210 — Deposition of Third Layer

212 — Sidewall Passivation and Isolation

214 — Metallization and Packaging

SYSTEMS AND METHODS FOR HYBRID PIN PBSE MID-WAVELENGTH INFRARED (MWIR) PHOTODETECTORS

CROSS-REFERENCE TO RELATED APPLICATIONS

This application hereby claims priority to and the benefit of U.S. Provisional Application Ser. No. 63/333,616, entitled "SYSTEMS AND METHODS FOR HYBRID PIN PbSe MID-WAVELENGTH INFRARED (MWIR) PHO-TODETECTORS," filed Apr. 22, 2023. U.S. Provisional Application Ser. No. 63/333,616 is hereby incorporated by reference in its entireties for all purposes.

BACKGROUND

Numerous applications employ photosensitive materials as detectors. However, conventional technologies can be expensive and complex to produce, and may have a narrow absorption range. Photosensitive materials with increased sensitivity, produced by less expensive and less complex processes, therefore desirable.

Further limitations and disadvantages of conventional and traditional approaches will become apparent to one of skill in the art, through comparison of such systems with the present disclosure as set forth in the remainder of the present application with reference to the drawings.

BRIEF SUMMARY

System and/or methods are provided for photodetectors employing a hybrid PIN or PN PbSe junction. In some examples, the junction can include one or more PbSe semiconducting layers, including n-type layers, n+-type layers, p(i)-type layers, and/or p+-type layers, as a list of non-limiting examples.

These and various other advantages, aspects and novel features of the present disclosure, as well as details of an illustrated embodiment thereof, will be more fully understood from the following description and drawings.

BRIEF DESCRIPTION OF THE DRAWINGS

The figures are not necessarily to scale. Where appropriate, similar or identical reference numbers are used to refer to similar or identical components.

DETAILED DESCRIPTION

Figure 1A:
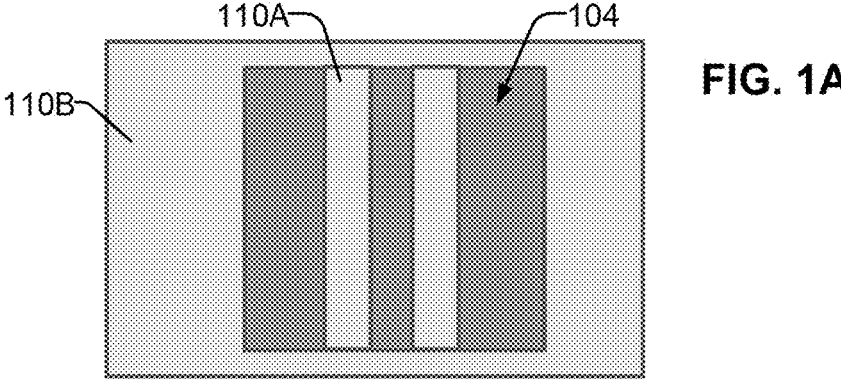
FIG. 1A illustrates a partial top view of the photodiode, in accordance with an example embodiment of the disclosure.

Disclosed are examples of systems and methods for photodetectors employing a hybrid PIN or PN Lead Selenium (PbSe) structures. In some examples, the PbSe junction can include one or more semiconducting layers, including n-type layers, n+-type layers, p(i)-type layers, and/or p+-type layers, as a list of non-limiting examples.

In this disclosure, photodetectors employing PbSe PIN or PN junctions are created. Also disclosed are methods for preparing photo-sensitive PbSe semiconducting layers for detection of electromagnetic energy (e.g., mid-wavelength infrared (MWIR), etc.).

In forming an example PbSe junction, a first PbSe n+-type layer may be prepared on a substrate by various physical and chemical deposition techniques including a pulsed laser deposition (PLD), molecular beam epitaxy (MBE), magnetron sputtering, electron-beam/thermal evaporation, or metal-organic chemical vapor deposition (MOCVD) techniques. A second p(i)-type layer may be formed via chemical deposition (e.g., chemical bath deposition (CBD) as well as other techniques mentioned above) on a surface of the first layer. A third p+-type layer may be formed via chemical deposition (e.g., CBD as well as other techniques mentioned above) on a surface of the second layer opposite the first layer.

The PbSe junction may be formed on a substrate (e.g., a Silicon wafer), which may include an ion-implantation layer (e.g., a doped semiconducting layer). The PbSe junction may be packaged as a photodetector to accommodate, and/or be tweaked to respond to, a range of wavelengths of the incident light. In some examples, the range of wavelengths can include in the infrared (IR) band particularly in the mid-wavelength infrared (MWIR) (e.g., 3-5 μm).

As provided herein, junctions at an interface between semiconducting layers are prepared with different doping levels and dopant types. Such junctions are common in a variety of electronic devices. For example, a PIN junction is a particular type of semiconducting junction that employs three layers, each with a different doping amount.

The PIN junction often includes an intrinsic (or undoped) semiconducting layer (e.g., a p(i) type layer), provided between two other semiconducting layers. Often, the two other semiconducting layers include a doped p-type layer and a doped n-type layer. The p- and n-type layers may have a similar doping level or have different doping levels, depending on a particular application or desired outcome. The doping level of one or both of the p- and n-type layers may be relatively high (in comparison to the intrinsic semiconducting layer), as these layers operate as ohmic contacts within a device (e.g., a photodetector).

The techniques employed to form or deposit each layer, the type of material used to prepare the one or more layers, as well as the dopant, may determine operating characteristics of the junction, such as the bandgap energy between the p- and n-type layers. In disclosed examples, a PIN junction is employed in a PbSe photodetector with a relatively wide intrinsic layer (e.g., p(i)-layer), providing favorable performance characteristics for photodetectors (e.g., within MWIR range).

A number of advantages are provided by use of a PIN PbSe photodetector and its morphological/structural engineering, such as the bandgap tunability, a relatively high response speed, operation with low noise, relatively high sensitivity to light, relatively low sensitivity to temperature, and can be manufactured at a low cost, in a small package, and provides adequate performance outcomes over a long period of use. Advantageously, the disclosed PbSe photodetectors provides a higher degree of sensitivity, and thus detectivity with wider temperature operation window, as well as cost effectiveness.

In disclosed examples, PbSe semiconducting layers produced by the disclosed methods can be employed in a photodetector, providing a low cost, small-package detector for use in a variety of applications particularly with no need of cooling part at a mid-wave IR applications. In coupled with other materials, for example, the disclosed PbSe photodetectors can be employed in other applications, products, and/or use cases (e.g., beyond detection), including in solar cells, light emitting diodes, and/or lasers, as a non-limiting list of examples.

As utilized herein, "and/or" means any one or more of the items in the list joined by "and/or". For example, "x and/or y" means any element of the three-element set {(x), (y), (x, y)}. Similarly, "x, y, and/or z" means any element of the seven-element set {(x), (y), (z), (x, y), (x, z), (y, z), (x, y, z)}. As utilized herein, the term "module" refers to functions that can be implemented in hardware, software, firmware, or any combination of one or more thereof. As utilized herein, the terms "example" or "exemplary" mean serving as a non-limiting example, instance, or illustration.

In an example of a single junction device, photons with incoming energy greater than the bandgap of the impacted material is absorbed. However, the excess energy of the photon is lost as heat via thermal relaxation. In order to reduce the energy loss due to thermal relaxation, and thereby increase conversion efficiency, multi-junction structures can be integrated by employing different semiconductor materials of varying bandgap energies. By adding additional layers for multi-junctions with other compound elements, the light absorption efficiency, thus spectral response, can be increased. Thus, high energy photons can be absorbed with greater efficiency in such multi-junction structures.

However, composition and manufacture of multi-junction semiconductors can increase the overall cost of the device, due to increased material use and production complexity. On the other hand, PbSe has a narrow bad gap that allows optical absorption of a greater range of the electromagnetic spectrum; most notably in the low- and mid-infrared region, where some semiconductor photovoltaic cells (e.g., Silicon) cannot absorb. Moreover, disclosed production of PbSe junctions and corresponding thin film is significantly less expensive than conventional semiconducting materials used in a photovoltaic mode operation.

In some disclosed examples, PbSe is used in forming the one or more semiconducting layers of the junction in the photodetector. PbSe is a polar semiconductor showing presenting both ionic and covalent chemical bonding, with electrons shared unequally by the nuclei forming these bonds. However, the covalent bonding is predominant in a resulting PbSe crystal. Crystalline PbSe thin films has a face-centered cubic lattice structure, which may have a lattice constant of about 6.12 Å (but could be smaller or greater, depending on desired characteristics). In some examples, the lattice structure may have a direct bandgap of about 0.27 eV for bulk material at room temperature, and may possess an intrinsic carrier density of $3 \times 10^{16}$ cm$^{-3}$ (although smaller or greater bandgaps and/or carrier density may be presented, depending on desired characteristics). Due to this narrow bandgap, the structure is sensitive to radiation in the infrared (IR) spectrum. For this reason, at least in part, some Lead Chalcogenides have been employed in a wide variety of applications, including IR sensors, photoresistors, photodiodes, IR lasers, and/or thermoelectric generators. PbSe, for example, offers detection at longer wavelengths in the IR spectrum, ranging from about 3 μm to about 5 μm.

Additionally, PbSe is a direct bandgap semiconductor that is capable of absorbing electromagnetic radiation in a material or layer with a thickness of as low as tens of nanometers, which is significantly thinner than conventional photosensitive materials, even those with a more narrow optical absorption range. Moreover, and advantageously, the disclosed PbSe junctions are relatively simple to manufacture in a large area at lower temperatures (e.g., in comparison to conventional semiconducting materials) by low cost fabrication techniques, such as solution-phase or thermal deposition, chemical bath deposition (CBD), etc.

Figure 1B:
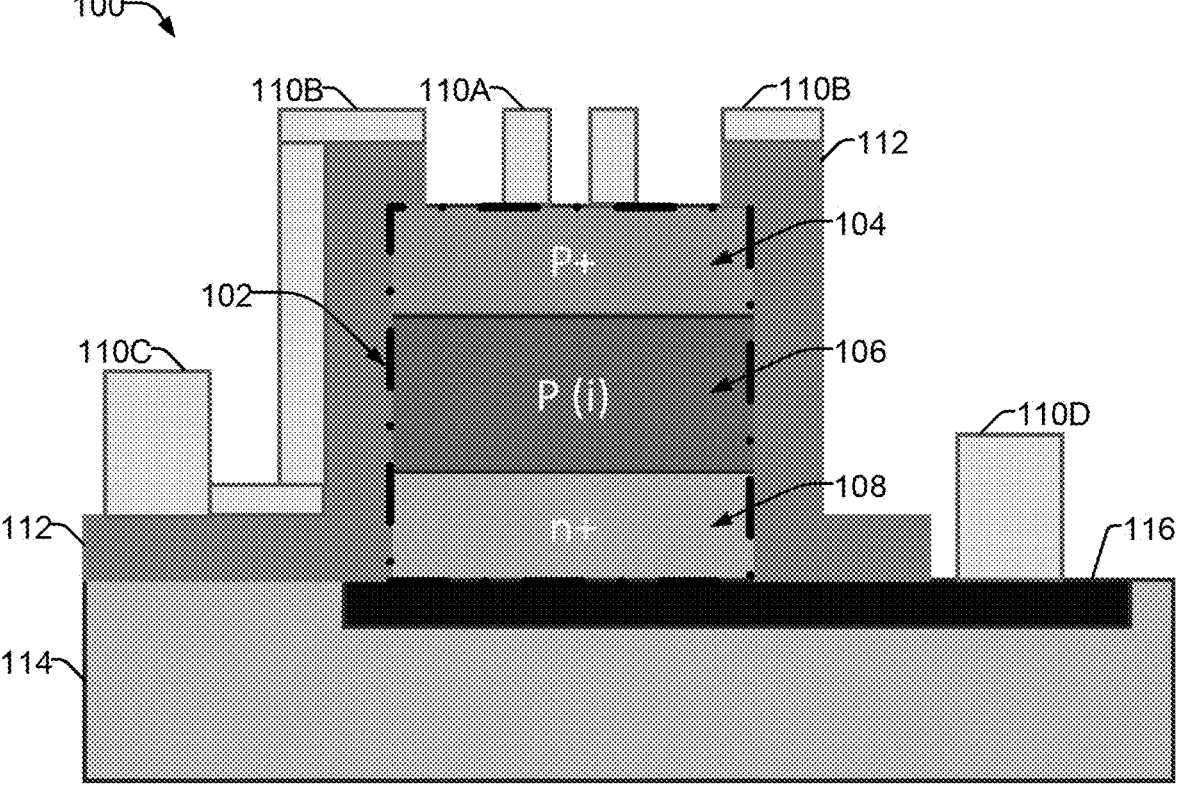
FIG. 1B illustrates a cross-sectional view of an example Lead Selenide (PbSe) photodetector, in accordance with an example embodiment of the disclosure.

FIG. 1B illustrates a cross-sectional view of an example photodetector 100. In the example of FIG. 1B, photodetector 100 is a PbSe photodetector employing a PIN junction 102. The PIN junction 102 includes a first layer 108 (e.g., n+-type layer), a second layer 106 (e.g., p(i)-type layer), and a third layer 104 (e.g., p+-type layer). Thus, the third layer 104 is configured to receive photons as a window and the absorbed photons generated the electro-hole pairs in the layer 106, with the second layer 106 serving as an intrinsic layer. PIN junction stacks can be reversed and the light can be absorbed via either top- or bottom-layer (e.g. via first layer 108 or third layer 104, as a thinned Si substrate).

The photodetector 100 employs a substrate 114, upon which the junction 102 is formed. In some examples, expensive Quartz substrate can be replaced with cheaper materials, such as silicon and/or glass. For instance, the substrate 114 can be a doped, n-type Si wafer. In some examples, the substrate 114 is Si with ion-implantation, Si with SiO$_2$, and/or glass (such as Indium Tin Oxide—ITO or other transparent conducting oxides on glass).

A layer 116 may be incorporated or otherwise formed on the substrate 114, which can be fully or partially exposed on a surface of the substrate. The layer 116 can additionally or alternatively be doped. For example, the layer 116 may be an ion-implantation layer (e.g., a doped n+ layer with phosphorus). In some examples, the layer 116 is defined by a doping level and/or carrier concentration different from (e.g., greater than) the substrate 114. The junction 102 is arranged on the layer 116 such that the layer forms a conductive pathway between the junction and a conductor (e.g., electrode portion 110D).

The junction 102 is partially enclosed within one or more sidewalls 112 to ensure charge separation between the junction and external components. The sidewalls 112 may be any number of suitable materials for isolation and/or passivation of the junction sidewall, such as dielectric materials (including, but not limited to, oxides, carbides, nitrides, fluoride, sulfide and/or their composites), and/or polymeric materials.

The first or bottom layer 108 (formed directly on the substrate 114 and/or the ion-implantation layer 116) comprises a n-type PbSe layer deposited via PLD (or other suitable deposition techniques described above). The first layer 108 is doped to have a relative high carrier concentration of approximately between $10^{18}$ and $10^{20}$ carriers per cm$^3$ (in comparison to the second layer 106). The resulting layer has a relatively high carrier concentration.

The second or middle layer 106 comprises a p-type PbSe layer, and can be formed via chemical deposition (e.g., CBD) or other suitable techniques mentioned above. The second layer 106 may be lightly doped, serving as an intrinsic zone between p-type and n-type doped layers 104 and 108, respectively. The second layer 106 has a much lower carrier concentration in comparison to the first or third layers 108, 104, respectively, with a carrier concentration up to approximately $10^{16}$ carriers per cm$^3$. Due to the relatively small amount of mobile carriers with external dopants, the second layer 106 acts as wide depletion layer between other layers. A formation of oxidation layer on the surface can be applied to the second layer 106 in some instances.

The third layer 104 comprises a p+-type PbSe layer. The third layer 104 can be formed via chemical deposition (e.g., CBD) or other suitable techniques. The third layer 104 is doped to have a relative high carrier concentration of approximately between $10^{17}$ and $10^{18}$ carriers per cm³ (in comparison to the second layer 106). A thin film oxidation can be applied to the third layer 104 in some instances.

Sidewalls 112 are formed on portions of the junction 102, the substrate 114 and/or the layer 116. The sidewalls 112 provide passivation and isolation layers between the junction 102 and other components, and can comprise one or more oxides, such as silicon dioxide ($SiO_2$), aluminum oxide ($Al_2O_3$), and/or another suitable material (dielectric materials (such as oxides, carbides, nitrides, fluorides, sulfides and/or their composites), and/or polymeric materials). The electrode portions 110A to 110D are formed on the photodiode 100 to provide a conductive pathway between electrode portions 110C and 110D through the junction 102. The electrode portions 110A-110D are formed of a conductive material (e.g., metals, including gold) and formed by one or more deposition techniques.

FIG. 1A illustrates a partial top view of the photodiode 100. The electrode portion 110B connects to electrode portion 110A, which provides a conductive pathway to the third layer 104.

Figure 2:
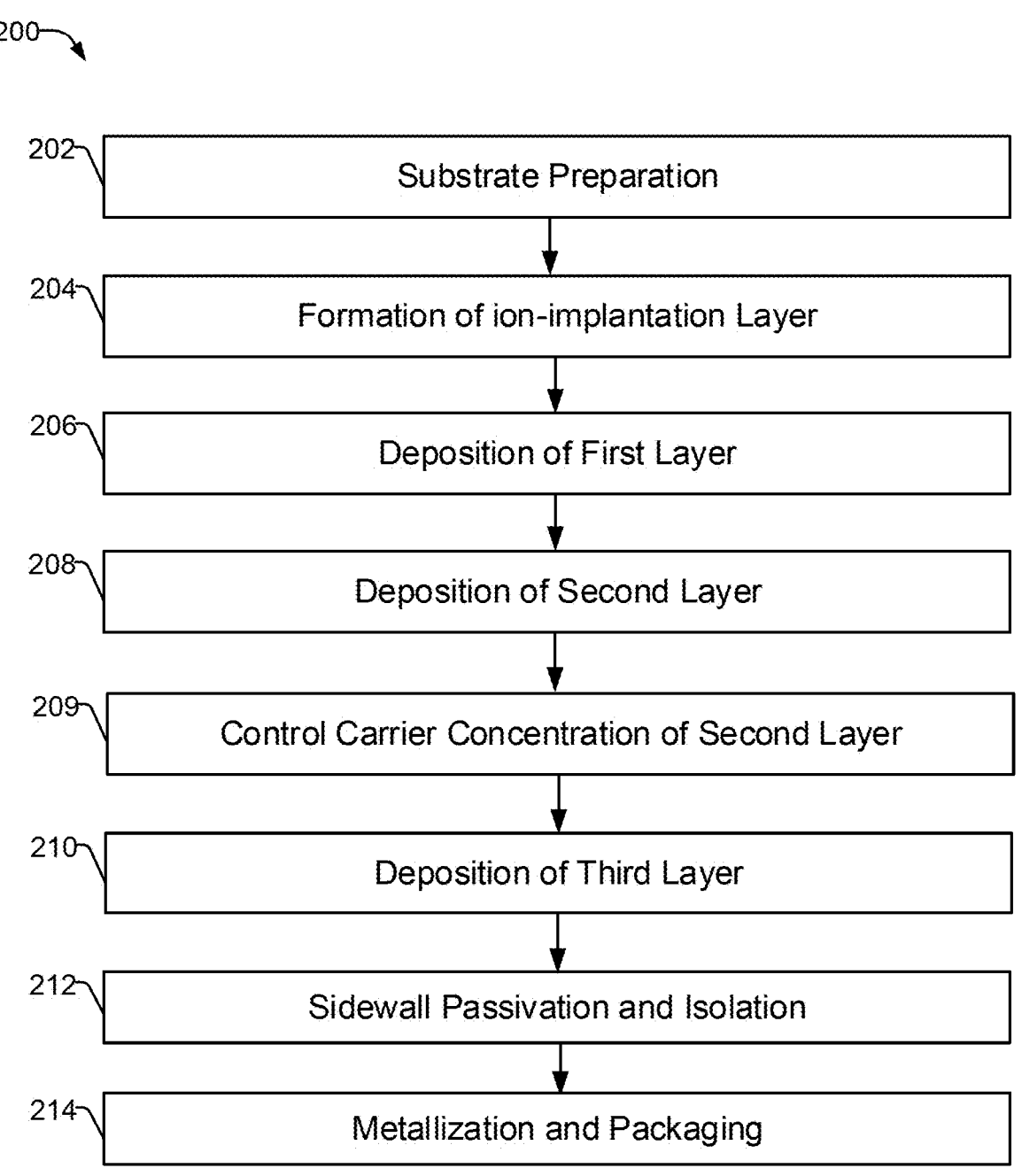
FIG. 2 illustrates an example method to form a Lead Selenide (PbSe) photodetector, in accordance with aspects of this disclosure.

In some disclosed examples, as illustrated in FIG. 2, a method 200 is provided to process a PbSe photodetector (e.g., employing a PIN junction, a PN junction, etc.), such as the PbSe photodetector 100. The method 200 consists of one or more of substrate preparation in block 202, formation of a ion-implantation layer in block 204, deposition of a first layer in block 206, deposition of a second layer in block 208, deposition of a third layer in block 210, sidewall passivation and isolation in block 212, and metallization and packaging in block 214.

In some examples, in block 202 the substrate can be prepared from a material selected from one of several suitable candidates, including sapphire, quartz, fused silica, oxidized silicon, silicon (Si), etc. In some examples, the substrate is subject to pre-cleaning, which may include additional or optional plasma cleaning, and/or a surface treatment to roughen one or more surfaces of the substrate in the step of substrate preparation.

The substrate can include a portion or layer linking the junction with a conductor, such as ion-implantation layer 116, deposited, formed, and/or otherwise incorporated into the substrate in block 204.

In block 206, a first layer can be a n-type PbSe semiconducting layer, and can be deposited by chemical and physical deposition techniques (e.g. PLD, MOCVD or MBE). In block 208, a second layer can be a p-type PbSe semiconducting layer, created by chemical deposition (e.g., CBD) of lightly doped PbSe. In block 209, a carrier concentration of the second layer can be controlled via oxygen and/or iodine sensitization, and/or processing by additional materials and/or treatments.

In block 210, a third layer can be a p+-type, heavily doped PbSe semiconducting layer, deposited by chemical deposition (e.g., CBD). In some examples, a thin film oxidation (e.g., oxygen sensitization, a thin coating or layer) can be applied to one or more of the layers, such as the second and third layers. Other deposition techniques can be applied for the formation of the second or third layer.

In block 212, a sidewall is formed passivate and/or isolate the junction. In some examples, the sidewall(s) are formed of a $SiO_2$ or $Al_2O_3$ material (e.g., dielectric materials (such as oxides, carbides, nitrides, fluorides, sulfides and/or their composites), and/or polymeric materials). In block 214, a metallization and packaging process is performed to provide conductive contacts, thereby creating a semiconducting PbSe photodetector.

In some additional or alternative examples, one or more layers are subjected to one or more heat treatments in ambient conditions (e.g., vacuum baking and/or post baking), oxygen sensitization, thin film iodination (e.g., iodine sensitization), and/or chemical etching, such as to remove oxide (e.g., following formation of the sidewalls). As provided herein, the process can proceed as listed, can proceed with one or more of the listed actions being optional, and/or arranged differently.

Figures 3A, 3B, 3C:
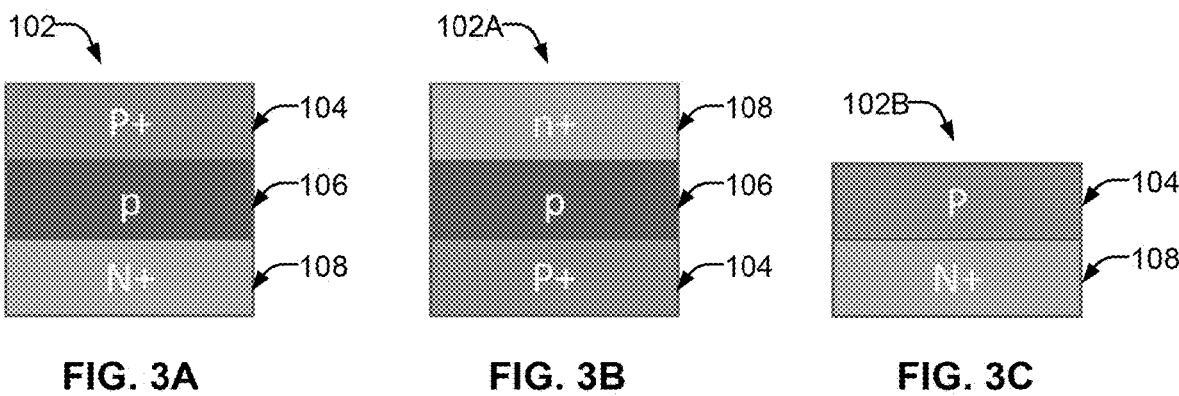
FIGS. 3A and 3B illustrate example PbSe PIN junctions, in accordance with aspects of this disclosure.
FIG. 3C illustrates an example PbSe PN junction, in accordance with aspects of this disclosure.

FIGS. 3A to 3C provide example PbSe junctions employed in the photodetector 100, as disclosed herein. FIG. 3A shows the example junction 102 as a PIN junction, with a first n+-type layer 108, a second p(i)-type layer 106, and a third p+-type layer 104, with the first layer 108 formed on the substrate 114 (as shown in FIG. 1B). The example junction 102A shown in FIG. 3B, however, provides the first layer 108 and third layers 104 (e.g., the n+-type layer and the p+-type layer, respectively) are exchanged, yielding a junction with similar capabilities to that of FIG. 3A.

In operation, a PIN photodiode employing junctions 102 or 102A operates in reverse bias. Reverse bias of the PIN photodiode can introduce a noise current, which reduces signal to noise ratio in operation. Further, reveres bias offers improved performance for high dynamic range applications (relative to PN photodiodes).

The intrinsic layer also increases the depletion region width. Carriers are generated in the intrinsic region, as that layer can be much thicker than a depletion region of a PN structure (which lacks an intrinsic layer). Another effect of the thick intrinsic region can be reduced capacitance, which allows for a higher detection bandwidth. The wide depletion layer provided by the intrinsic layer further ensures that PIN diodes have a high reverse breakdown characteristic. As capacitance reduces with increasing separation, the depletion region will be wider than a comparable diode employing a PN junction (as shown in FIG. 3C). This can be either PN+ or N+P in stack.

A PN junction 102B is shown in FIG. 2C for use in a PN photodiode. The PN junction 102B provides a first n-type layer 108 and a second p-type layer 104, with first layer 108 formed on the substrate. In some examples, the order of layers can be reversed relative to the substrate. Some examples PN photodiodes provide capabilities distinct from a PIN photodiode. For example, a PN photodiode does not require a reverse bias, and as a result may demonstrate sensitivity to low light applications.

Figure 4:
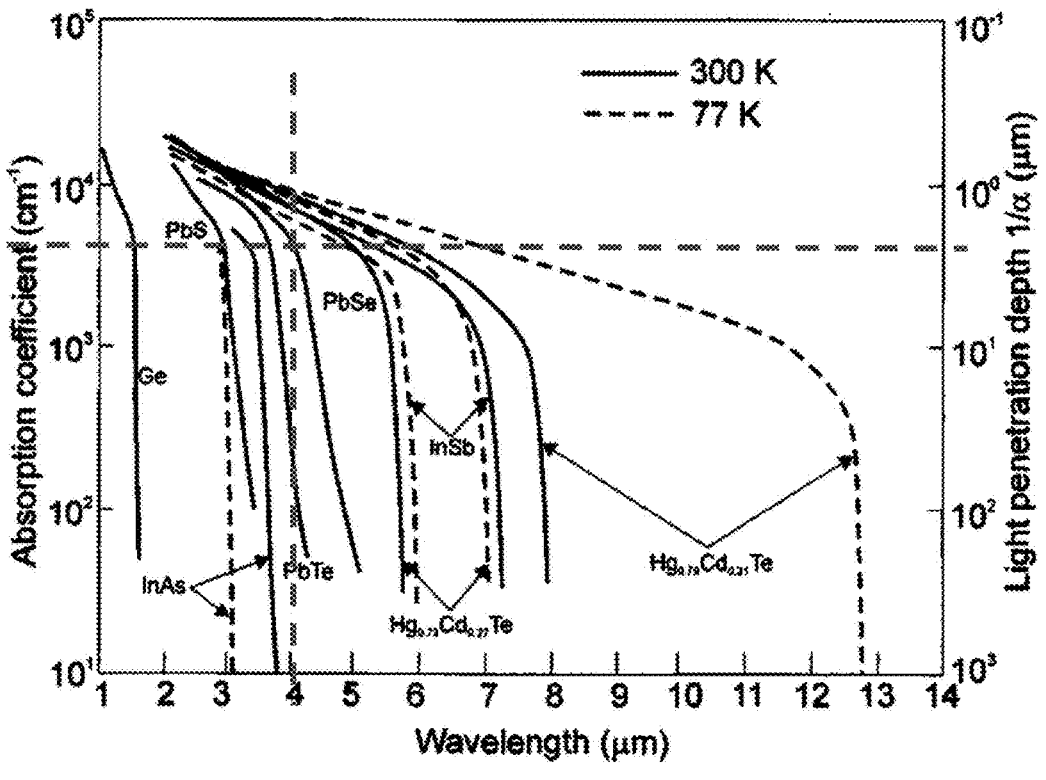
FIG. 4 is a graph providing light penetration depth of a variety of materials, in accordance with aspects of this disclosure.

FIG. 4 illustrates an example annotated graph of light penetration depth. The graph is an example from a submission to the Journal of Applied Physics (see, e.g., Journal of Applied Physics 93, 4355 (2003); https://doi.org/10.1063/1.1558224). The absorption coefficient and light penetration depth for various photodetector materials is shown with a spectral range of 1-14 µm. As shown, PbSe experiences a notable turn at approximately 4 µm, corresponding to an absorption coefficient approaching $10^4$ per cm, and light penetration depth approaching 1/α (µm) (approximately 1.7 µm in depth).

Although several examples and/or embodiments are described with respect to PbSe layers, the principles and/or advantages disclosed herein can employ technologies that are not limited to a particular type of material and/or application.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method of forming a photodetector with a lead selenide (PbSe) junction, comprising:
    preparing a substrate;
    forming-an ion-implantation layer in or above the substrate;
    depositing a first layer of heavily doped PbSe on the substrate and ion-implantation layer;
    depositing a second layer of lightly doped or undoped PbSe layer on the first layer;
    depositing a third layer of heavily doped PbSe on the second layer opposite the first layer, wherein the first layer, the second layer, and the third layer are included in the junction;
    forming a sidewall on one or more of the substrate, the ion-implantation layer, the first layer, the second layer, or the third layer; and
    forming one or more electrodes to provide a conductive pathway through the junction.

2. The method of claim 1, further comprising applying an oxidation layer on one or more of the second or third layers.

3. The method of claim 1, wherein a doping level of the first layer is substantially similar to a doping level of the third layer.

4. The method of claim 1, wherein a doping level of the first layer is greater than a doping level of the third layer.

5. The method of claim 1, wherein the first layer is deposited on the substrate and ion-implantation layer via pulsed laser deposition (PLD).

6. The method of claim 1, wherein the first layer is deposited on the substrate and ion-implantation layer via molecular beam epitaxy (MBE).

7. The method of claim 1, wherein the first layer is deposited on the substrate and ion-implantation layer via metal-organic chemical vapor deposition (MOCVD).

8. The method of claim 1, wherein the second layer is deposited on the first layer via a chemical bath deposition.

9. The method of claim 1, wherein the third layer is deposited on the second layer via a chemical bath deposition.

10. The method of claim 1, wherein the one or more electrodes is formed on the third layer.

11. A method of forming a photodetector with a lead selenide (PbSe) junction, comprising:
    preparing a substrate;
    forming an ion-implantation layer in or above the substrate;
    depositing a first layer of doped PbSe on the substrate and ion-implantation layer;
    depositing a second layer of doped PbSe layer on the first layer, wherein the first layer and the second layer are included in the junction;
    controlling the carrier concentration of the second layer;
    forming a sidewall on one or more of the substrate, the ion-implantation layer, the first layer, or the second layer; and
    forming one or more electrodes to provide a conductive pathway through the junction.

12. The method of claim 11, wherein the first layer is deposited on the substrate and ion-implantation layer via pulsed laser deposition (PLD).

13. The method of claim 11, further comprising applying an oxidation layer on one or more of the first or second layers.

14. The method of claim 11, wherein a doping level of the first layer is substantially similar to a doping level of the third layer.

15. The method of claim 11, wherein a doping level of the first layer is greater than a doping level of the second layer.

16. The method of claim 11, wherein the first layer is deposited on the substrate and ion-implantation layer via molecular beam epitaxy (MBE).

17. The method of claim 11, wherein the first layer is deposited on the substrate and ion-implantation layer via metal-organic chemical vapor deposition (MOCVD).

18. The method of claim 11, wherein the second layer is deposited on the first layer via a chemical bath deposition.

19. The method of claim 11, wherein the carrier concentration of the second layer is controlled via oxygen or iodine sensitization.

* * * * *